US010254363B2

(12) United States Patent
Umeda (10) Patent No.: US 10,254,363 B2
(45) Date of Patent: Apr. 9, 2019

(54) MAGNETIC RESONANCE IMAGING APPARATUS, MAGNETIC RESONANCE IMAGING METHOD, AND MEDICAL DATA ANALYSIS APPARATUS

(71) Applicant: TOSHIBA MEDICAL SYSTEMS CORPORATION, Otawara-shi, Tochigi (JP)

(72) Inventor: Masaaki Umeda, Sakura Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1146 days.

(21) Appl. No.: 14/560,754

(22) Filed: Dec. 4, 2014

(65) Prior Publication Data

US 2015/0160316 A1  Jun. 11, 2015

(30) Foreign Application Priority Data

Dec. 6, 2013  (JP) .................................. 2013-253512

(51) Int. Cl.
*G01R 33/48*  (2006.01)
*G01R 33/28*  (2006.01)
*G01R 33/56*  (2006.01)
*G01R 33/46*  (2006.01)

(52) U.S. Cl.
CPC ..... *G01R 33/4828* (2013.01); *G01R 33/5607* (2013.01); *G01R 33/4625* (2013.01)

(58) Field of Classification Search
None
See application file for complete search history.

(56) References Cited

U.S. PATENT DOCUMENTS 5,709,208 A * 1/1998 Posse ................. G01R 33/4833
324/307
6,069,478 A * 5/2000 Hurd .................... G01R 33/485
324/300

(Continued)

FOREIGN PATENT DOCUMENTS

| JP | 1996-071057 | 3/1996 |
|----|-------------|--------|
| JP | 2002-263079 | 9/2002 |
| JP | 2006-346055 | 12/2006 |

OTHER PUBLICATIONS

First Japanese office action dated Jul. 10, 2018, in Patent Application No. JP 2014-206786.

*Primary Examiner* — Jermele M Hollington
*Assistant Examiner* — Suresh K Rajaputra
(74) *Attorney, Agent, or Firm* — Nixon & Vanderhye P.C.

(57) ABSTRACT

According to one embodiment, a magnetic resonance imaging apparatus includes a data acquiring part and a data processing part. The data acquiring part is configured to acquire magnetic resonance signals for a magnetic resonance spectroscopy analysis from an object. The data processing part is configured to obtain a frequency spectrum of magnetic resonance signals whose first magnetic resonance signal component from a first metabolite and second magnetic resonance signal component from a second metabolite have been suppressed by data processing of the magnetic resonance signals acquired by said data acquiring part. The data processing suppresses the first magnetic resonance signal component and the second magnetic resonance signal component.

10 Claims, 5 Drawing Sheets

(56) References Cited

U.S. PATENT DOCUMENTS

| | | | | |
|---|---|---|---|---|
| 6,891,371 B1* | 5/2005 | Frigo | ................. | G01R 33/4625 324/307 |
| 2007/0188172 A1* | 8/2007 | Garwood | ............... | G01N 24/10 324/310 |
| 2010/0260397 A1* | 10/2010 | Block | ................ | G01R 33/4824 382/131 |
| 2011/0140696 A1* | 6/2011 | Yu | ...................... | G01R 33/4828 324/309 |
| 2011/0227572 A1* | 9/2011 | Deshpande | ........ | G01R 33/5607 324/309 |
| 2012/0119740 A1* | 5/2012 | Takahashi | .............. | A61B 5/055 324/309 |
| 2015/0253411 A1* | 9/2015 | Umeda | ............ | G01R 33/56518 324/318 |

* cited by examiner

MAGNETIC RESONANCE IMAGING APPARATUS, MAGNETIC RESONANCE IMAGING METHOD, AND MEDICAL DATA ANALYSIS APPARATUS

CROSS REFERENCES TO RELATED APPLICATIONS

This application is based upon and claims the benefit of priority from Japanese Patent Application No. 2013-253512, filed on Dec. 6, 2013; the entire contents of which are incorporated herein by reference.

Further, the entire contents of Japanese Patent Application No. 2014-206786, filed on Oct. 7, 2014 are incorporated herein by reference.

FIELD

Embodiments described herein relate generally to an MRI (magnetic resonance imaging) apparatus, a magnetic resonance imaging method and a medical data analysis apparatus.

BACKGROUND

The MRI apparatus is an imaging diagnostic apparatus which magnetically excites nuclear spins of an object set in a static magnetic field with RF (radio frequency) signals having the Larmor frequency and reconstructs an image based on MR (magnetic resonance) signals generated due to the excitation.

As one of image analysis methods in MRI, MRS (magnetic resonance spectroscopy) is known. MRS is a data analysis method for studying types and components of molecules in a living body, based on an amount of a chemical shift in a resonant frequency and intensities of MR signals.

In MRS, it is required to suppress MR signals from water (water signals) and MR signals from fat (fat signals). Especially, suppression of water signals and fat signals is important in MRS of a breast or a prostate.

Thus, a method of acquiring MR signals with applying a CHESS (chemical shift selective) pulse to suppress water signals frequency-selectively and a SPAIR (SPectral Attenuated Inversion Recovery) pulse to suppress fat signals frequency-selectively is known.

However, when non-uniformity in a magnetic field in a data acquisition target is non-negligible, water signals and fat signals may not be suppressed sufficiently even if pre-pulses such as a fat saturation pulse and a water saturation pulse are applied. In this case, it might be difficult to obtain a satisfactory spectrum.

Accordingly, an object of the present invention is to provide a magnetic resonance imaging apparatus, a magnetic resonance imaging method and a medical data analysis apparatus which can satisfactorily suppress MR signals from metabolites including water signals and fat signals in MRS.

DETAILED DESCRIPTION

In general, according to one embodiment, a magnetic resonance imaging apparatus includes a data acquiring part and a data processing part. The data acquiring part is configured to acquire magnetic resonance signals for a magnetic resonance spectroscopy analysis from an object. The data processing part is configured to obtain a frequency spectrum of magnetic resonance signals whose first magnetic resonance signal component from a first metabolite and second magnetic resonance signal component from a second metabolite have been suppressed by data processing of the magnetic resonance signals acquired by said data acquiring part. The data processing suppresses the first magnetic resonance signal component and the second magnetic resonance signal component.

Further, according to another embodiment, a magnetic resonance imaging method includes: acquiring magnetic resonance signals for a magnetic resonance spectroscopy analysis from an object; and obtaining a frequency spectrum of magnetic resonance signals whose first magnetic resonance signal component from a first metabolite and second magnetic resonance signal component from a second metabolite have been suppressed by data processing of the acquired magnetic resonance signals. The data processing suppresses the first magnetic resonance signal component and the second magnetic resonance signal component.

Further, according to another embodiment, a medical data analysis apparatus includes a data obtaining part and a data processing part. The data obtaining part is configured to obtain magnetic resonance signals for a magnetic resonance spectroscopy analysis. The magnetic resonance signals have been acquired from an object. The data processing part is configured to obtain a frequency spectrum of magnetic resonance signals whose first magnetic resonance signal component from a first metabolite and second magnetic resonance signal component from a second metabolite have been suppressed by data processing of the magnetic resonance signals obtained by said data obtaining part. The data processing suppresses the first magnetic resonance signal component and the second magnetic resonance signal component.

A magnetic resonance imaging apparatus, a magnetic resonance imaging method and a medical data analysis apparatus according to embodiments of the present invention will be described with reference to the accompanying drawings.

Figure 1:
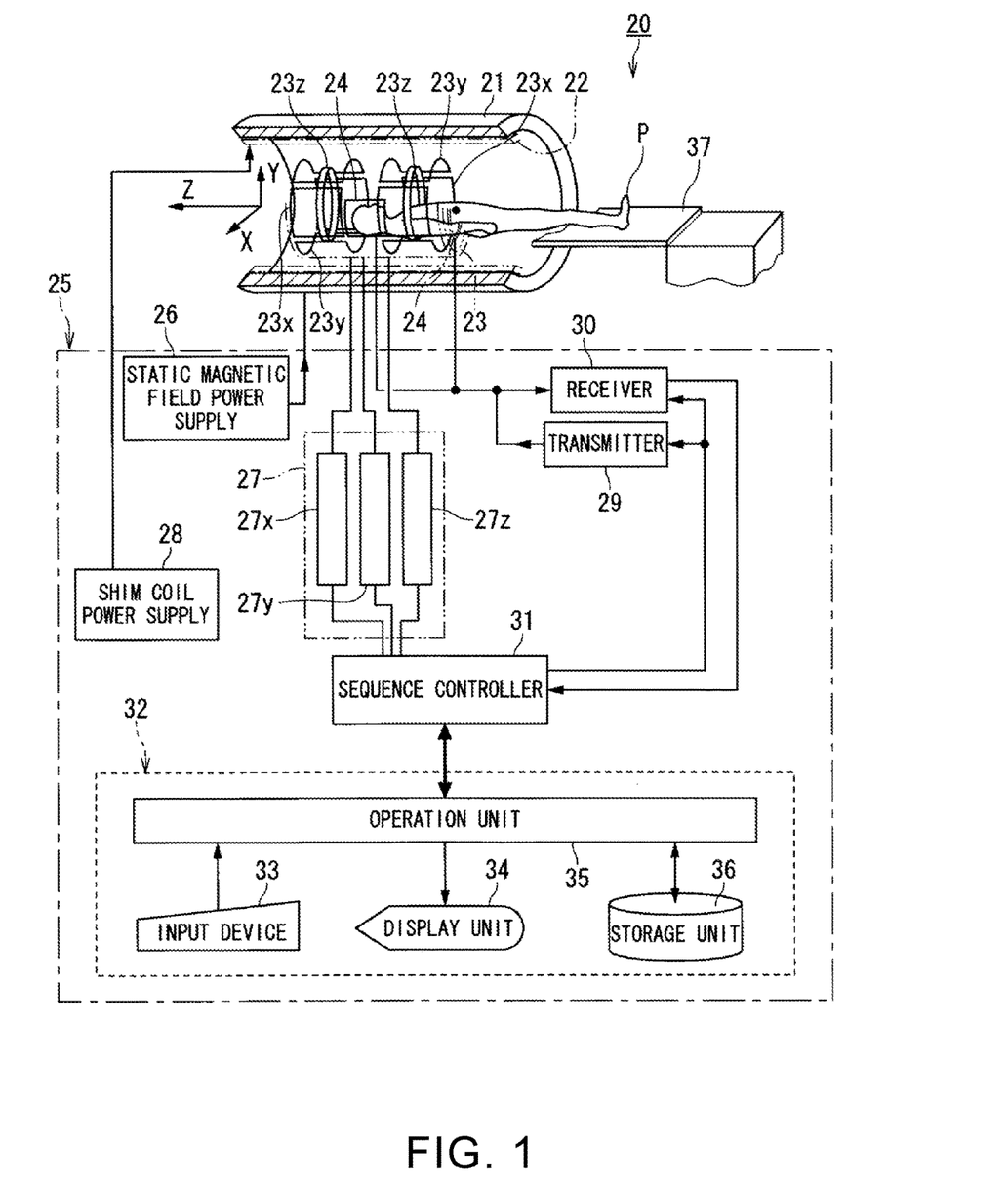
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a cylinder-shaped static field magnet 21, a shim coil 22, a gradient coil 23 and RF coils 24. The static field magnet 21 generates a static magnetic field. The shim coil 22 is arranged inside the static field magnet 21.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z, which is cylinder-shaped, is arranged inside the static field magnet 21. The gradient coil 23 has also a bed 37 in the area formed inside it which is an imaging area. The bed 37 supports an object P. The RF coils 24 include a WBC (whole body coil), which is built in a gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 transmits RF signals given from the transmitter 29 to the object P. The reception RF coil 24 receives MR signals generated due to nuclear spins inside the object P which are excited by the RF signals to give to the receiver 30.

The sequence controller 31 of the control system 25 communicates with the gradient power supply 27, the transmitter 29 and the receiver 30. The sequence controller 31 stores sequence information describing control information needed in order to drive the gradient power supply 27, the transmitter 29 and the receiver 30, and generates gradient magnetic fields Gx, Gy and Gz in the X, Y and Z directions and RF signals by driving the gradient power supply 27, the transmitter 29 and the receiver 30 according to a predetermined stored sequence. The above-described control information includes motion control information, such as intensities, application durations and application timings of electric current pulses which should be applied to the gradient power supply 27.

The sequence controller 31 is also configured to give raw data to the computer 32. The raw data, which are complex-valued data, are generated by the receiver 30 performing detection and A/D (analog to digital) conversion of MR signals.

The transmitter 29 gives RF signals to the RF coil 24 in accordance with control information provided from the sequence controller 31. Meanwhile, the receiver 30 performs detection, necessary signal processing and A/D conversion of MR signals given from the RF coils 24 to generate raw data which are digitized complex-valued data. The generated raw data are given from the receiver 30 to the sequence controller 31.

The computer 32 has various functions by the operation unit 35 executing programs stored in the storage unit 36 of the computer 32. Alternatively, specific circuits having various functions may be provided to the magnetic resonance imaging apparatus 20, instead of at least a part of the computer programs.

Figure 2:
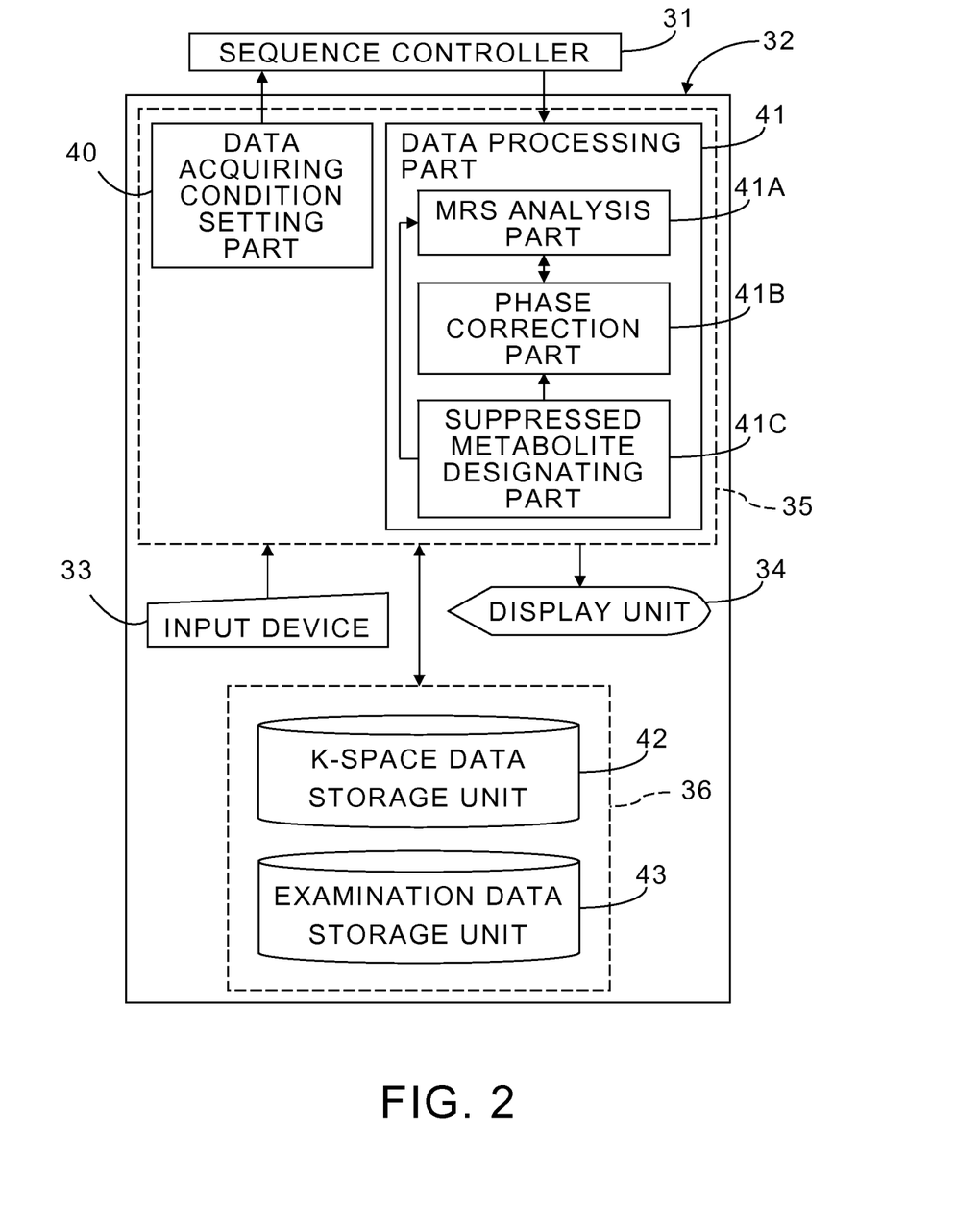
FIG. 2 is a functional block diagram of the computer shown in FIG. 1.

FIG. 2 is a functional block diagram of the computer 32 shown in FIG. 1.

The operation unit 35 of the computer 32 functions as a data acquiring condition setting part 40 and a data processing part 41 by executing programs stored in the storage unit 36. The data processing part 41 has an MRS analysis part 41A, a phase correction part 41B and a suppressed metabolite designating part 41C. Moreover, the storage unit 36 functions as a k-space data storage unit 42 and an examination data storage unit 43.

The data acquiring condition setting part 40 sets data acquiring conditions for MR imaging or an MRS analysis based on direction information from the input device 33 and outputs the set data acquiring conditions to the sequence controller 31. A pulse sequence with application of a fat saturation pulse and a water saturation pulse can be set as a data acquiring condition for MRS analysis. Furthermore, data acquiring conditions can be set for repeatedly acquiring MR signals multiple times for averaging, in order to improve an SNR (signal to noise ratio) of MRS analysis data.

The data processing part 41 obtains examination information based on MR signals acquired by a data acquisition scan under data acquiring conditions set in the data acquiring condition setting part 40. When acquired MR signals are MR signals for an MRS analysis, a frequency spectrum of the MR signals is obtained as examination information by data analysis processing including an FT (Fourier transform) of the MR signals. The frequency spectrum of MR signals obtained as the examination information can be displayed on the display unit 34 as MRS analysis data. The frequency spectrum of MR signals can also be stored in the examination data storage unit 43 as MRS analysis data.

On the other hand, when acquired MR signals are imaging data for generating MR image data, the MR image data are generated as examination information based on the imaging data. Generating MR image data can be performed by arranging imaging data to a k-space formed in the k-space data storage unit 42, generating real space data by image reconstruction processing including FT of k-space data arranged in the k-space, and necessary image processing of the real space data. The generated MR image data can be displayed on the display unit 34 as diagnostic image data and stored in the examination data storage unit 43.

The MRS analysis part 41A generates MRS analysis data by analysis processing based on MR signals for an MRS analysis. The MRS analysis data can be obtained by convolution processing of MR signals, subtraction processing for subtracting signals after the convolution processing from the signals before the convolution processing, and processing for obtaining a frequency spectrum of the subtraction signals, which are obtained by the subtraction processing, by an FT of the subtraction signals. As preprocessing or postprocessing of these MRS analysis processing, necessary processing, such as averaging and an eddy magnetic field correction, is performed in the MRS analysis part 41A.

Especially, the MRS analysis part 41A is configured to perform convolution processing of signals in the time domain. Processing of signals in the time domain is processing of signals expressed using the time axis. Signals in the time domain can be obtained by an IFT (inverse Fourier transform) of signals in the frequency domain. On the contrary, when signals in the time domain are subjected to an FT, signals in the frequency domain can be obtained. Furthermore, a convolution filter in the time domain is obtained by an IFT of a convolution filter in the frequency domain. On the contrary, when a convolution filter in the time domain is subjected to an FT, a convolution filter in the frequency domain can be obtained. In addition, the MRS analysis part 41A is configured to repeatedly perform the convolution processing and the subtraction processing of signals after a phase correction in the phase correction part 41B.

The phase correction part 41B performs a phase correction of signals, which are a target of the convolution processing and the subtraction processing, so that a resonant frequency of signals from a metabolite to be suppressed in a frequency spectrum of signals obtained as MRS analysis data becomes a center frequency of MR signals. The phase correction part 41B also performs a phase inverse correction, which returns a frequency of signals after the convolution processing and the subtraction processing to a frequency before the phase correction, when signals after the phase correction have been subjected to the convolution processing and the subtraction processing.

Then, a frequency spectrum of MR signals whose signals from desired metabolites have been suppressed can be generated by setting MR signals after the phase correction in the phase correction part 41B as a target of the convolution processing and the subtraction processing in the MRS analysis part 41A.

Note that, although water signals and fat signals are typical as metabolite signals to be suppressed in a frequency spectrum of signals, other metabolite signals can also be a suppression target. Since water signals to be a suppression target are acquired under conditions that a resonant frequency of the water signals is a center frequency of MR signals, a phase correction as post-processing for suppressing water signals is not necessarily required.

The suppressed metabolite designating part 41C designates metabolite signals to be suppressed in a frequency spectrum of signals, based on direction information input from the input device 33. Metabolites to be suppression targets in the frequency spectrum of signals may be manually designated by a user while metabolite signals, such as water signals and fat signals, to be suppressed can be previously determined. In that case, a user can manually designate metabolites to be suppression targets by inputting designating information of the metabolites, to be the suppression targets, from the input device 33 to the suppressed metabolite designating part 41C.

The information specifying designated metabolites is informed from the suppressed metabolite designating part 41C to the MRS analysis part 41A and the phase correction part 41B. Then, the phase correction part 41B performs a phase correction so that a resonant frequency of metabolite which has been informed from the suppressed metabolite designating part 41C becomes a center frequency of MR signals while the MRS analysis part 41A performs convolution processing and subtraction processing of MR signals of which center frequency is a resonant frequency of metabolite which has been informed from the suppressed metabolite designating part 41C.

Further, a user may manually designate a part of metabolite signals to be suppressed while the other part may be previously determined as a default. Therefore, when metabolites whose signal components should be suppressed consist of the first metabolite and the second metabolite, the suppressed metabolite designating part 41C can designate at least one of the first metabolite and the second metabolite.

The data acquiring condition setting part 40, having the functions as mentioned above, of the computer 32 functions as a data acquiring part configured to acquire MR signals for MR imaging or for an MRS analysis from an object P, by cooperating with hardware, such as the static field magnet 21, the shim coil 22, the gradient coil 23 and the RF coils 24. However, the data acquiring part may be configured by other elements so long as similar functions are provided.

On the other hand, the data processing part 41 of the computer 32 obtains a frequency spectrum of MR signals, in which the first MR signal component from the first metabolite, such as an MR signal component from water, and the second MR signal component from the second metabolite, such as an MR signal component from fat, have been suppressed by data processing for suppressing the first MR signal component and the second MR signal component. The data processing is performed to MR signals acquired for an MRS analysis by the above mentioned data acquiring part.

Next, an operation and action of the magnetic resonance imaging apparatus 20 will be described.

Figure 3:
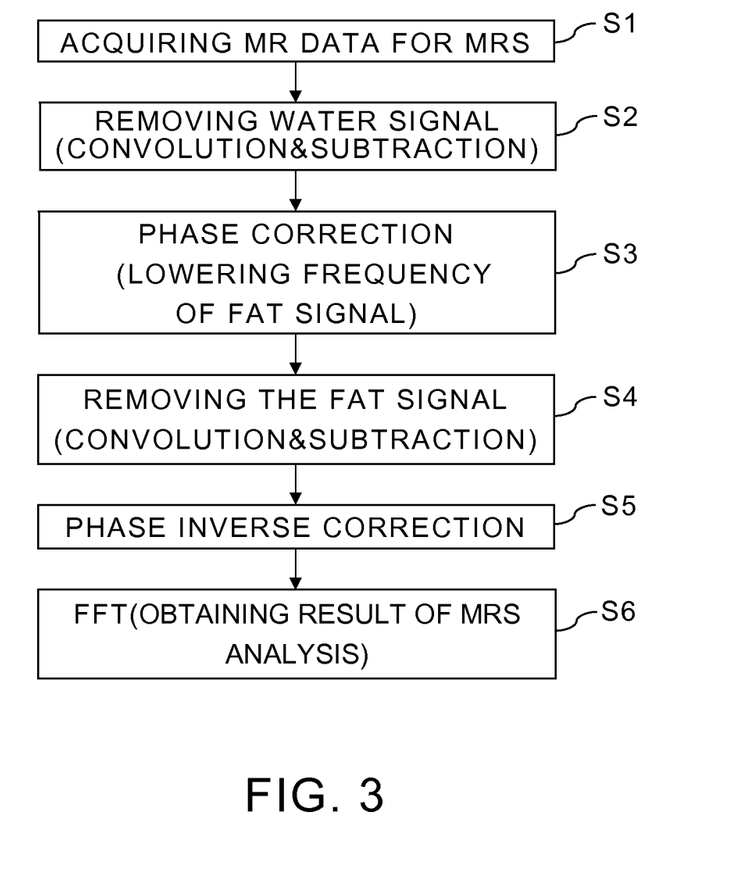
FIG. 3 is a flowchart showing a flow for obtaining MRS analysis data which have suppressed water signals and fat signals by the magnetic resonance imaging apparatus shown in FIG. 1.

FIG. 3 is a flowchart showing a flow for obtaining MRS analysis data which have suppressed water signals and fat signals by the magnetic resonance imaging apparatus 20 shown in FIG. 1.

Firstly, an object P is set on the bed 37, and a static magnetic field is generated in an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated in the imaging area.

Next, in step S1, data acquiring conditions for an MRS analysis are set by the data acquiring condition setting part 40, and MR signals for the MRS analysis are acquired according to the set data acquiring conditions.

Specifically, the data acquiring conditions, including a pulse sequence, set in the data acquiring condition setting part 40 are output to the sequence controller 31 from the data acquiring condition setting part 40. Then, the sequence controller 31 drives the gradient power supply 27, the transmitter 29, and the receiver 30 in accordance with the data acquiring conditions, thereby generating gradient magnetic fields at an imaging area having the set object P, and further generating RF signals from the RF coil 24.

Consequently, the RF coil 24 receives MR signals generated due to the nuclear magnetic resonance in the object P. Then, the receiver 30 receives the MR signals from the RF coil 24 and performs necessary signal processing of the MR signals. Subsequently, the receiver 30 outputs the MR signals to the computer 32 through the sequence controller 31.

Next, in step S2, the MRS analysis part 41A in the data processing part 41 removes the water signals from the MR signals for the MRS analysis. Note that, necessary preprocessing, such as averaging, is performed in the MRS analysis part 41A prior to removing the water signals.

The processing for removing the water signals can be performed by an operation shown by the formula (1).

$$S1cor(t)=S1(t)-S1(t)*G(t) \quad (1)$$

In the formula (1), S1(t) represents the acquired MR signals, G(t) represents a Gaussian function used as a convolution filter on the time domain, * represents a convolution operation, and S1cor(t) represents the MR signals after the processing for removing the water signals, respectively.

As shown by the formula (1), convolution processing of the MR signals S1(t) in the time domain by the Gaussian function G(t) extracts the water signals S1(t)*G(t), which are a low-frequency component of the MR signals S1(t). Then, subtraction processing subtracts the water signals S1(t)*G(t), extracted by the convolution processing, from the MR signals S1(t) before the convolution processing. As a result, the MR signals S1cor(t) without the water signals S1(t)*G(t) can be obtained.

Next, in step S3, the phase correction part 41B performs a phase correction of the MR signals S1cor(t), from which the water signals S1(t)*G(t) have been removed. This phase correction is performed so that the resonant frequency of the fat signal component included in the MR signals S1cor(t) becomes a center frequency of the MR signals S1(t), which are the acquired data. Therefore, the phase correction is an operation shown by the formula (2).

$$S2(t)=S1cor(t)\exp(2\pi n\Delta f\Delta t) \quad (2)$$

In the formula (2), n represents the number of data points of the MR signals S1cor(t), $\Delta f$ represents a difference in frequency between the fat signals and the water signals, and $\Delta t$ represents a time per data point of the MR signals S1cor(t), respectively. Under 1.5 [T] of a magnetic field, the difference in frequency between the fat signals and the water signals is −225 [Hz]. The time $\Delta t$ per data point of the MR signals S1cor(t) is generally about $1\times10^{-3}$ [s].

By the operation shown by the formula (2), MR signals S2(t) whose center frequency of the fat signals has become a low-frequency region are obtained.

Next, in step S4, the MRS analysis part 41A removes the fat signals from the MR signals S2(t) whose frequency of the fat signals has become low.

The processing for removing the fat signals can be performed by an operation shown by the formula (3).

$$S2cor(t)=S2(t)-S2(t)*G(t) \quad (3)$$

In the formula (3), S2(t) represents the MR signals whose frequency of fat signals has become low, G(t) represents a Gaussian function used as a convolution filter on the time domain, * represents a convolution operation, and S2cor(t) represents the MR signals after the processing for removing the fat signals, respectively.

As shown by the formula (3), the fat signals are removed by an operation similar to the processing for removing the water signals. As a result, the MR signals S2cor(t) from which both the water signals and the fat signals have been removed are obtained.

Next, in step S5, the phase correction part 41B performs a phase correction with a phase correction amount obtained by inverting a sign of a phase correction amount of the phase correction in step S3. Specifically, phase inverse correction processing is performed to cancel the phase correction in step S3 of the MR signals S2cor(t), from which both the water signals and the fat signals have been removed, as shown by the formula (4).

$$S(t)=S2cor(t)\exp(-2\pi n\Delta f\Delta t) \quad (4)$$

Thereby, MR signals S(t), in which the frequency corresponding to the removed water signals has become a low-frequency region and the frequency corresponding to the removed fat signals has become an original frequency before the phase correction in step S3, are obtained.

Next, in step S6, the MRS analysis part 41A obtains a frequency spectrum of MR signals as MRS analysis data D by an FFT (fast Fourier transform) of the MR signals S(t) after the phase inverse correction. This operation is shown by the formula (5).

$$D=FFT\{S(t)\} \quad (5)$$

The frequency spectrum obtained by the formula (5) has been generated based on the MR signals from which water signals and the fat signals had been removed. Therefore, the frequency spectrum has a waveform useful for a diagnosis. That is, a satisfactory frequency spectrum, in which both the water signals and the fat signals have been suppressed, can be obtained.

As mentioned above, a frequency spectrum of MR signals, from which water signals and fat signals have been suppressed, can be obtained by data processing including the first subtraction processing, the first phase correction, the second subtraction processing, the second phase correction, and an FT of MR signals after the second phase correction. The first subtraction processing suppresses the water signals by subtracting signals, after a convolution in the time domain of the MR signals, from the MR signals. The first phase correction makes a center frequency of the MR signals after the first subtraction processing become the resonant frequency of the fat signals. The second subtraction processing suppresses the fat signals by subtracting signals, after a convolution in the time domain of the MR signals after the first phase correction, from the MR signals after the first phase correction and before the convolution. The second phase correction makes a center frequency of the MR signals after the second subtraction processing become the resonant frequency of the removed water signals.

Note that, although only water signals and fat signals are suppression targets in the above-mentioned example, metabolite signals from another metabolite or other plural metabolites may also be suppression targets. Furthermore, the order of processing to remove metabolite signals, including the water signals, from plural metabolites is arbitrary.

Specifically, in a case of suppressing two kinds of metabolite signals, the first MR signal component can be suppressed by subtracting signals, after a convolution in the time domain of MR signals whose center frequency is a resonant frequency of the first metabolite, from the MR signals before the convolution. Meanwhile, the second MR signal component can be suppressed by subtracting signals, after a convolution in the time domain of MR signals after a phase correction, from the MR signals before the convolution and after the phase correction. The MR signals after the phase correction can be obtained by the phase correction of the MR signals, before suppressing the first MR signal component or after suppressing the first MR signal component, which makes the center frequency of the MR signals become a resonant frequency of the second metabolite.

Alternatively, in a case of suppressing at least three kinds of metabolite signals, a frequency spectrum of MR signals, from which the first MR signal component, the second MR signal component and the third MR signal component have been suppressed, can be obtained by data processing further including processing for suppressing the third MR signal component, from the third metabolite, of the MR signals. In this case, what is necessary is to perform data processing including a phase correction for making a center frequency of MR signals become a resonant frequency of the second metabolite and another phase correction for making a center frequency of MR signals become a resonant frequency of the third metabolite.

The resonant frequency of water signals is a center frequency of MR signals acquired by a scan. Therefore, in a case of suppressing plural kinds of metabolite signals other than the water signals, what is necessary is to perform the phase correction of MR signals for making their center frequency become a resonant frequency of one kind of metabolite signals, a removal of the kind of metabolite signals by the convolution processing and the subtraction processing of the MR signals after the phase correction, and the phase inverse correction for canceling the phase correction, for each kind of metabolite signals which should be suppressed. In other words, in a case of suppressing plural kinds of metabolite signals other than the water signals, what is necessary is to repeat a series of the processing, consisting of the phase correction, the convolution, the subtraction processing and the phase inverse correction, multiple times according to plural resonant frequencies corresponding to the plural metabolites.

That is, the magnetic resonance imaging apparatus 20 as mentioned above is configured to remove plural metabolite signals by MRS analysis processing instead of data acquiring conditions, such as application of a saturation pulse.

Therefore, according to the magnetic resonance imaging apparatus 20, a frequency spectrum of MR signals in which unnecessary plural metabolite signals, such as water signals and fat signals, have been suppressed can be obtained. Especially, in an MRS analysis of a prostate or a breast, not only water signals but fat signals, which have conventionally been difficult to be suppressed, can be sufficiently suppressed. As a result, a frequency spectrum of MR signals having a satisfactory waveform can be obtained.

Figure 4:
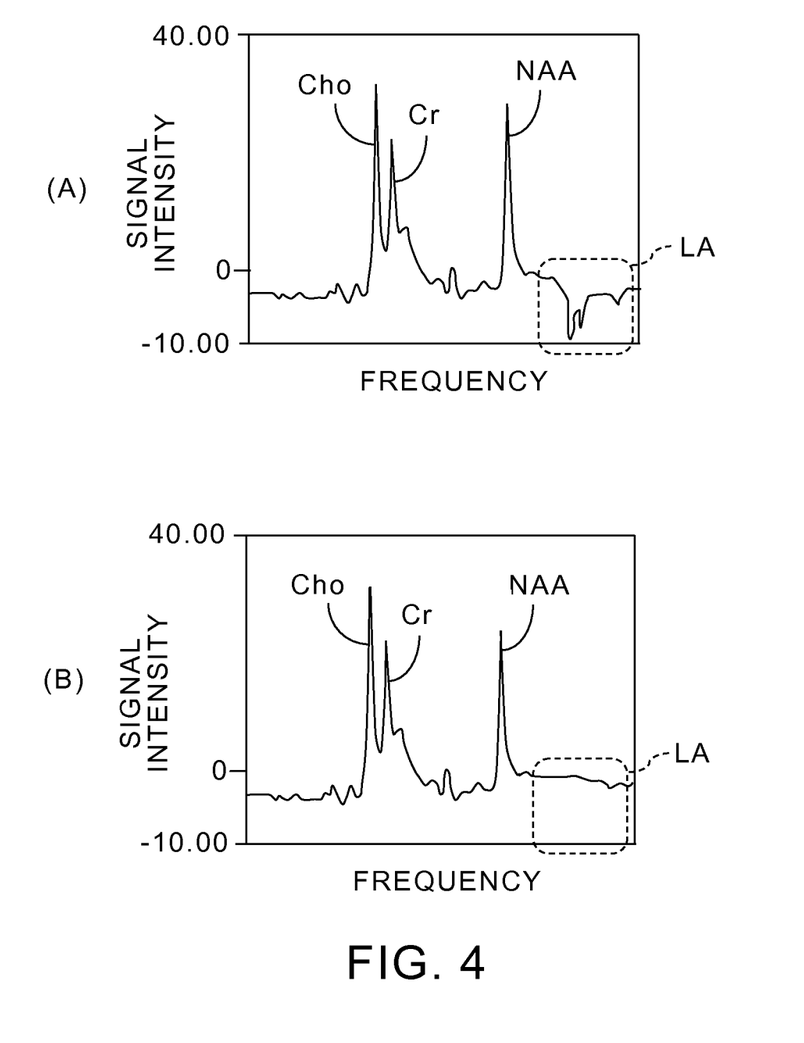
FIG. 4 shows an MRS analysis result, obtained by the magnetic resonance imaging apparatus shown in FIG. 1, with comparing to the conventional MRS analysis result.

FIG. 4 shows an MRS analysis result, obtained by the magnetic resonance imaging apparatus 20 shown in FIG. 1, with comparing to the conventional MRS analysis result.

In FIG. 4 (A), (B), each horizontal axis shows a frequency and each vertical axis shows intensity of MR signals. FIG. 4 (A) shows a frequency spectrum of MR signals which have been acquired by the conventional method. FIG. 4 (B) shows a frequency spectrum of MR signals which have been acquired by the processing shown in FIG. 3.

The frequency spectrum of the MR signals shown in FIG. 4 (A) was obtained by acquiring the MR signals from a phantom, including water and LA (lactic acid), and performing an MRS analysis by the conventional method. As shown in FIG. 4 (A), no peak is at the resonant frequency of the water signals in the left end, which means the water signals have been suppressed. Furthermore, the respective peaks of Cho (choline), Cr (creatine) and NAA (N-acetylaspartic acid) have appeared from the side near the resonant frequency of the water signals. However, a negative peak corresponding to LA signals has appeared in the region, surrounded by the dotted line, in the higher frequency side than that corresponding to the peak of NAA. That is, the LA signals have not been sufficiently suppressed.

On the contrary, when an MRS analysis is performed according to the processing shown in FIG. 3, the LA signals can also be sufficiently suppressed along with the water signals as shown in FIG. 4 (B). That is, it is confirmed that metabolite signals other than water signals could be sufficiently suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, although the embodiment mentioned above has been described as a case where an MRS analysis is performed in the computer 32 included in the magnetic resonance imaging apparatus 20, an MRS analysis can also be performed in an independent medical data analysis apparatus connected with a desired magnetic resonance imaging apparatus through a network.

Figure 5:
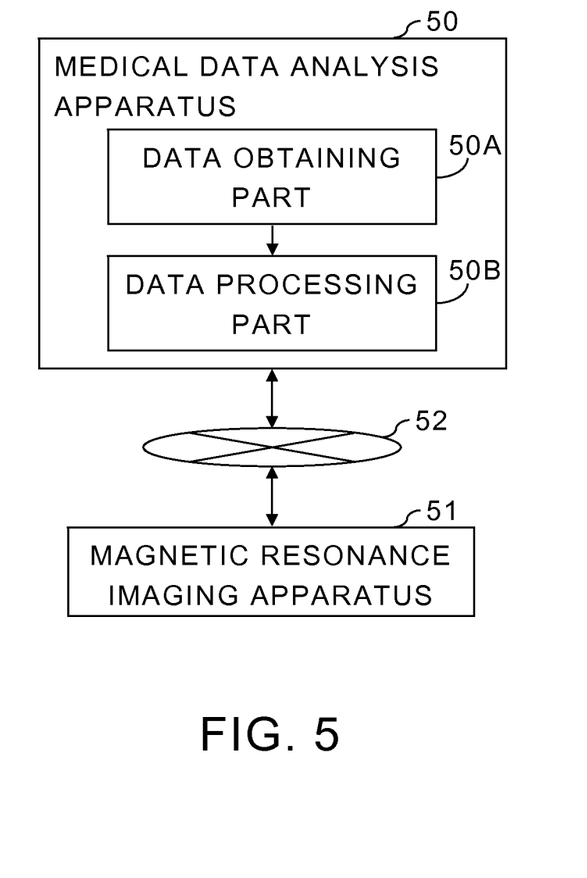
FIG. 5 is a diagram showing an example of medical data analysis apparatus connected with a magnetic resonance imaging apparatus through a network.

FIG. 5 is a diagram showing an example of a medical data analysis apparatus connected with a magnetic resonance imaging apparatus through a network.

As shown in FIG. 5, a medical data analysis apparatus 50 can be connected directly or indirectly with a desired magnetic resonance imaging apparatus 51 through a network 52. The medical data analysis apparatus 50 can include a data obtaining part 50A and a data processing part 50B. The data obtaining part 50A obtains MR signals for an MRS analysis, which have been acquired from an object, directly or indirectly from the desired magnetic resonance imaging apparatus 51 through the network 52. The data processing part 50B obtains a frequency spectrum of MR signals, from which the first MR signal component from the first metabolite and the second MR signal component from the second metabolite have been suppressed by data processing for suppressing the first MR signal component and the second MR signal component. The data processing is performed for the MR signals obtained by the data obtaining part 50A.

Besides a case where the data processing part 41 as a medical data analysis apparatus is built in the magnetic resonance imaging apparatus 20 as exemplified in FIG. 2, the medical data analysis apparatus 50 can be configured by reading program into a computer also in a case where the medical data analysis apparatus 50 is connected to the arbitrary magnetic resonance imaging apparatus 51 through the network 52. Furthermore, circuits may be used to configure the medical data analysis apparatus 50.

What is claimed is:

1. A magnetic resonance imaging (MRI) apparatus comprising:
   MRI system components including static and gradient magnetic field generators, at least one radio frequency (RF) coil, RF transmitter and receiver circuits and at least one processor configured to cause the MRI system components to
   acquire magnetic resonance (MR) signals for a magnetic resonance spectroscopy (MRS) analysis from an object; and
   obtain a frequency spectrum of MR signals whose first MR signal component from a first metabolite and second MR signal component from a second metabolite have been suppressed by data processing of the acquired MR signals, the data processing suppressing the first MR signal component and the second MR signal component.

2. A magnetic resonance imaging apparatus of claim 1, wherein said at least one processor is further configured to: designate at least one of the first metabolite and the second metabolite.

3. A magnetic resonance imaging apparatus of claim 1, wherein said data processing performs a phase correction of MR signals whose center frequency is a resonant frequency of the first metabolite and suppress the second signal component using MR signals after the phase correction, the phase correction shifting the center frequency to a resonant frequency of the second metabolite.

4. A magnetic resonance imaging apparatus of claim 1, signal component by first processing and the second MR signal component by second processing, the first processing subtracting first signals from signals whose center frequency is a resonant frequency of the first metabolite, the first signals being signals after convolution in a time domain of the MR signals whose center frequency is the resonant frequency of the first metabolite, the second processing subtracting second signals from MR signals after a phase correction, the second signals being signals after the convolution or another convolution in the time domain of the MR signals after the phase correction, the phase correction being performed for MR signals before or after suppressing the first MR signal component, the phase correction shifting a center frequency of the MR signals before the phase correction to become a resonant frequency of the second metabolite.

5. A magnetic resonance imaging apparatus of claim 1, wherein said data processing obtains a frequency spectrum of MR signals whose the first MR signal component, the second MR signal component and a third MR signal component from a third metabolite having been suppressed by data processing further including processing for suppressing the third MR signal component of the acquired MR signals.

6. A magnetic resonance imaging apparatus of claim 5, wherein said data processing performs data processing including a phase correction for shifting a center frequency of MR signals to a resonant frequency of the second metabolite and another phase correction for shifting a center frequency of magnetic resonance signals to a resonant frequency of the third metabolite.

7. A magnetic resonance imaging apparatus of claim 1, wherein said data processing obtains a frequency spectrum of MR signals whose water signals and fat signals have been suppressed by data processing including first subtraction processing, a first phase correction, second subtraction processing, a second phase correction, and a Fourier transform of MR signals after the second phase correction, the first subtraction processing suppressing the water signals by subtracting first signals from the acquired MR signals, the first signals being signals after convolution in a time domain of the acquired MR signals, the first phase correction shifting a center frequency of MR signals after the first subtraction processing to a resonant frequency of the fat signals, the second subtraction processing suppressing the fat signals by subtracting second signals from MR signals after the first phase correction, the second signals being signals after the convolution or another convolution in the time domain of the MR signals after the first phase correction, the second phase correction shifting a center frequency of MR signals after the second subtraction processing become the resonant frequency of the removed water signals.

8. A magnetic resonance imaging apparatus of claim 1, wherein said data processing performs data processing for suppressing a MR signal component from water and a MR signal component from fat.

9. A magnetic resonance imaging (MRI) method comprising:
configuring and using an MRI system to effect
acquiring magnetic resonance (MR) signals for a magnetic resonance spectroscopy (MRS) analysis from an object; and
obtaining a frequency spectrum of MR signals whose first MR signal component from a first metabolite and second MR signal component from a second metabolite have been suppressed by data processing of the acquired signals, the data processing suppressing the first MR signal component and the second MR signal component.

10. A medical magnetic resonance image (MRI) data analysis apparatus comprising:
a source of magnetic resonance (MR) signals acquired from an object using an MRI system including static and gradient magnetic field generators, at least one radio frequency (RF) coil, RF transmitter and receiver circuits and at least one processor configured to
obtain MR signals for a magnetic resonance spectroscopy (MRS) analysis, the MR signals having been acquired from an object; and
obtain a frequency spectrum of MR signals whose first MR signal component from a first metabolite and second MR signal component from a second metabolite have been suppressed by data processing of the obtained MR signals, the data processing suppressing the first MR signal component and the second MR signal component.

* * * * *